United States Patent
Larson et al.

(10) Patent No.: US 9,028,646 B2
(45) Date of Patent: May 12, 2015

(54) FILM ADHESIVE FOR SEMICONDUCTOR VACUUM PROCESSING APPARATUS

(71) Applicant: Lam Research Corporation, Fremont, CA (US)

(72) Inventors: Dean J. Larson, Pleasanton, CA (US); Tom Stevenson, Gilroy, CA (US); Victor Wang, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 83 days.

(21) Appl. No.: 13/869,603

(22) Filed: Apr. 24, 2013

(65) Prior Publication Data

US 2013/0292048 A1 Nov. 7, 2013

Related U.S. Application Data

(62) Division of application No. 12/746,810, filed as application No. PCT/US2008/013466 on Dec. 18, 2008, now Pat. No. 8,449,786.

(60) Provisional application No. 61/008,144, filed on Dec. 19, 2007.

(51) Int. Cl.
| | |
|---|---|
| *H01L 21/67* | (2006.01) |
| *B32B 37/12* | (2006.01) |
| *H01L 21/687* | (2006.01) |

(52) U.S. Cl.
CPC .......... *H01L 21/67069* (2013.01); *B32B 37/12* (2013.01); *H01L 21/68757* (2013.01); *H01L 21/67103* (2013.01)

(58) Field of Classification Search
CPC ........................ H01L 21/67069; B32B 37/12
USPC ....................... 156/247, 60, 256, 645.51, 329
See application file for complete search history.

(56) References Cited

U.S. PATENT DOCUMENTS

| 4,340,462 A | 7/1982 | Koch |
| 4,908,095 A | 3/1990 | Kagatsume et al. |

(Continued)

FOREIGN PATENT DOCUMENTS

| JP | 02-027748 A | 1/1990 |
| JP | 07-335731 A | 12/1995 |

(Continued)

OTHER PUBLICATIONS

International Search Report and Written Opinion mailed Jul. 24, 2009 for PCT/US2008/013466.

(Continued)

*Primary Examiner* — Daniel Lee
(74) *Attorney, Agent, or Firm* — Buchanan Ingersoll & Rooney PC

(57) ABSTRACT

A bonded assembly to reduce particle contamination in a semiconductor vacuum chamber such as a plasma processing apparatus is provided, including an elastomeric sheet adhesive bond between mating surfaces of a component and a support member to accommodate thermal stresses. The elastomeric sheet comprises a silicone adhesive to withstand a high shear strain of ≥800% at a temperature range between room temperature and 300° C. such as heat curable high molecular weight dimethyl silicone with optional fillers. The sheet form has bond thickness control for parallelism of bonded surfaces. The sheet adhesive may be cut into pre-form shapes to conform to regularly or irregularly shaped features, maximize surface contact area with mating parts, and can be installed into cavities. Installation can be manually, manually with installation tooling, or with automated machinery. Composite layers of sheet adhesive having different physical properties can be laminated or coplanar.

18 Claims, 9 Drawing Sheets

(56) References Cited

U.S. PATENT DOCUMENTS

| | | |
|---|---|---|
| 4,948,458 A | 8/1990 | Ogle |
| 5,074,356 A | 12/1991 | Neff |
| 5,200,232 A | 4/1993 | Tappan et al. |
| 5,262,029 A | 11/1993 | Erskine et al. |
| 5,569,356 A | 10/1996 | Lenz et al. |
| 5,690,795 A | 11/1997 | Rosenstein et al. |
| 5,744,199 A | 4/1998 | Joffre et al. |
| 5,766,364 A | 6/1998 | Ishida et al. |
| 5,801,915 A | 9/1998 | Kholodenko et al. |
| 5,820,723 A | 10/1998 | Benjamin et al. |
| 5,838,529 A | 11/1998 | Shufflebotham et al. |
| 5,863,376 A | 1/1999 | Wicker et al. |
| 5,906,683 A | 5/1999 | Chen et al. |
| 5,951,814 A | 9/1999 | Saito et al. |
| 5,969,934 A | 10/1999 | Larsen |
| 6,071,630 A | 6/2000 | Tomeru et al. |
| 6,073,577 A * | 6/2000 | Lilleland et al. .......... 118/723 E |
| 6,074,518 A | 6/2000 | Imafuku et al. |
| 6,095,083 A | 8/2000 | Rice et al. |
| 6,148,765 A | 11/2000 | Lilleland et al. |
| 6,194,322 B1 | 2/2001 | Lilleland et al. |
| 6,227,140 B1 | 5/2001 | Kennedy et al. |
| 6,256,187 B1 | 7/2001 | Matsunaga et al. |
| 6,365,063 B2 | 4/2002 | Collins et al. |
| 6,376,385 B2 | 4/2002 | Lilleland et al. |
| 6,378,378 B1 | 4/2002 | Fisher |
| 6,379,806 B1 | 4/2002 | Takamura et al. |
| 6,408,786 B1 | 6/2002 | Kennedy et al. |
| 6,468,925 B2 | 10/2002 | Campbell et al. |
| 6,475,336 B1 | 11/2002 | Hubacek |
| 6,491,784 B2 | 12/2002 | Yamaguchi et al. |
| 6,723,202 B2 | 4/2004 | Nagaiwa et al. |
| 6,753,498 B2 | 6/2004 | Sirkis et al. |
| 6,762,395 B2 | 7/2004 | Yagnik et al. |
| 6,786,175 B2 | 9/2004 | Dhindsa et al. |
| 6,797,639 B2 | 9/2004 | Carducci et al. |
| 6,813,134 B2 | 11/2004 | Tatsumi et al. |
| 6,818,096 B2 | 11/2004 | Barnes et al. |
| 6,827,815 B2 | 12/2004 | Hytros et al. |
| 6,831,307 B2 * | 12/2004 | Fujii ........................... 257/180 |
| 6,838,012 B2 | 1/2005 | Lenz |
| 6,858,311 B2 | 2/2005 | Sumita et al. |
| 6,881,608 B2 | 4/2005 | Wicker |
| 6,882,537 B2 | 4/2005 | Barcley |
| 6,890,861 B1 | 5/2005 | Bosch |
| 6,899,109 B1 | 5/2005 | Nguyen |
| 6,983,892 B2 | 1/2006 | Noorbakhsh et al. |
| 7,019,956 B2 | 3/2006 | Fujii et al. |
| 7,074,849 B2 | 7/2006 | Nakayoshi et al. |
| 7,110,506 B2 | 9/2006 | Radley et al. |
| 7,137,444 B2 | 11/2006 | Faybishenko et al. |
| 7,159,537 B2 | 1/2007 | Wickramanayaka et al. |
| 7,196,283 B2 | 3/2007 | Buchberger, Jr. et al. |
| 7,220,497 B2 | 5/2007 | Chang |
| 7,220,937 B2 | 5/2007 | Hofman et al. |
| 7,270,713 B2 | 9/2007 | Blonigan et al. |
| 7,296,534 B2 | 11/2007 | Fink |
| 7,337,745 B1 | 3/2008 | Komino et al. |
| 7,468,880 B2 | 12/2008 | Itakura et al. |
| 7,479,304 B2 | 1/2009 | Sun et al. |
| 7,543,547 B1 | 6/2009 | Kennedy et al. |
| 7,644,745 B2 | 1/2010 | Le et al. |
| 7,645,341 B2 | 1/2010 | Kennedy et al. |
| 7,661,386 B2 | 2/2010 | Kasai et al. |
| 7,672,110 B2 | 3/2010 | Sun et al. |
| 7,712,434 B2 | 5/2010 | Dhindsa et al. |
| 7,854,820 B2 | 12/2010 | de la Llera et al. |
| 7,861,667 B2 | 1/2011 | Fischer et al. |
| 7,862,682 B2 | 1/2011 | Stevenson et al. |
| 7,939,778 B2 | 5/2011 | Larson et al. |
| 8,080,107 B2 | 12/2011 | Kennedy et al. |
| 8,147,648 B2 | 4/2012 | Dhindsa |
| 8,161,906 B2 | 4/2012 | Kadkhodayan et al. |
| 8,206,506 B2 | 6/2012 | Kadkhodayan et al. |
| 8,221,582 B2 | 7/2012 | Patrick et al. |
| 8,317,968 B2 | 11/2012 | Dhindsa et al. |
| 8,418,649 B2 | 4/2013 | Larson et al. |
| 8,449,679 B2 | 5/2013 | Dhindsa |
| 8,449,786 B2 | 5/2013 | Larson et al. |
| 8,701,268 B2 | 4/2014 | Larson et al. |
| 2002/0108711 A1 | 8/2002 | Kim |
| 2002/0127853 A1 | 9/2002 | Hubacek et al. |
| 2003/0185729 A1 | 10/2003 | Ko et al. |
| 2004/0187787 A1 | 9/2004 | Dawson et al. |
| 2007/0068629 A1 | 3/2007 | Shih et al. |
| 2007/0187038 A1 | 8/2007 | Ren et al. |
| 2010/0224323 A1 | 9/2010 | Himori |
| 2010/0224325 A1 | 9/2010 | Himori et al. |
| 2011/0155322 A1 | 6/2011 | Himori et al. |
| 2011/0162799 A1 | 7/2011 | Hayashi |
| 2011/0226420 A1 | 9/2011 | Hayashi et al. |
| 2011/0226421 A1 | 9/2011 | Hayashi |

FOREIGN PATENT DOCUMENTS

| | | |
|---|---|---|
| JP | 09-298233 A | 11/1997 |
| JP | 2000-174105 A | 6/2000 |
| JP | 2001-226656 A | 8/2001 |
| JP | 2002-231797 A | 8/2002 |
| JP | 2003-258072 A | 9/2003 |
| JP | 2005-523584 A | 8/2005 |
| JP | 2007-035878 A | 2/2007 |
| WO | WO 2007/011613 A2 | 1/2007 |

OTHER PUBLICATIONS

NuSil Silicone Technology, CF1-135 High Technology Silicone Primer (Clear), Product Profile, Product Catalog, Jul. 26, 2005.

NuSil Silicone Technology, CV-2680-12 Controlled Volatility Film Adhesive, Product Profile, Product Catalog, Jul. 25, 2006.

NuSil Silicone Technology, CV-2943 Thermally Conductive, Controlled Volatility RTV Silicone, Product Profile, Product Catalog, Feb. 6, 2004.

NuSil Silicone Technology, CV-2946 Thermally Conductive, Controlled Volatility Silicone, Product Profile, Product Catalog, Feb. 24, 2005.

NuSil Silicone Technology, SP-120 SP-121 Silicone Primers, Product Profile, Product Catalog, Jul. 26, 2005.

Dow Corning, Sep. 5, 2012, Dow Corning Website Describing 93-500 material.

Dow Corning, Sep. 5, 2012, Dow Corning Website Describing 93-500 MSDS.

http://www.matweb.com.

Official Action mailed Aug. 7, 2012 for Japanese Appln. No. 2010-539430.

Notification of Examination Opinion issued Jun. 25, 2014 for Taiwan Patent Appln. No. 97149367.

* cited by examiner

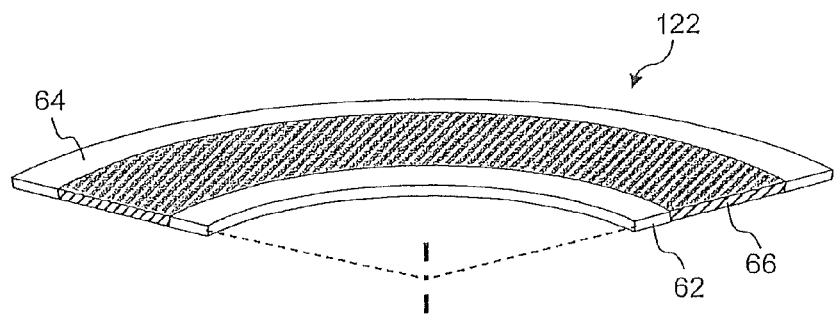
FIG. 4
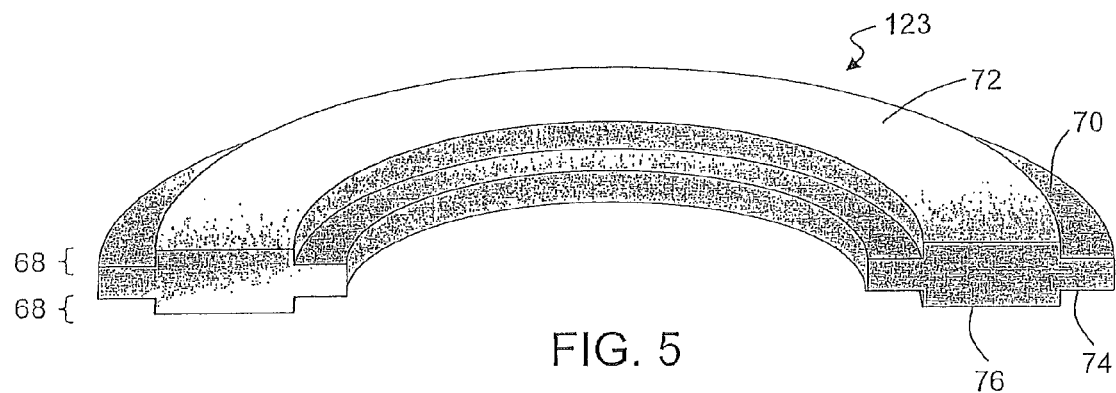
FIG. 5
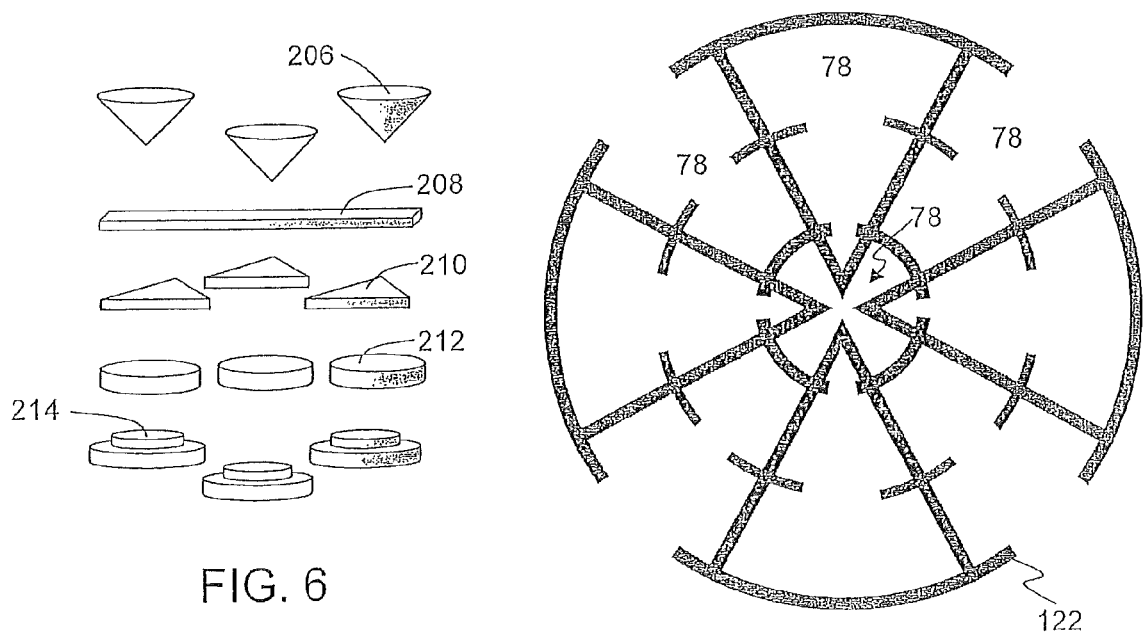
FIG. 6
FIG. 7

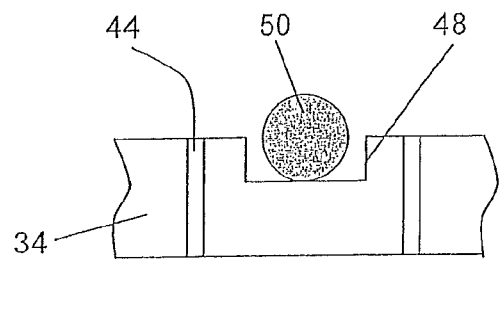
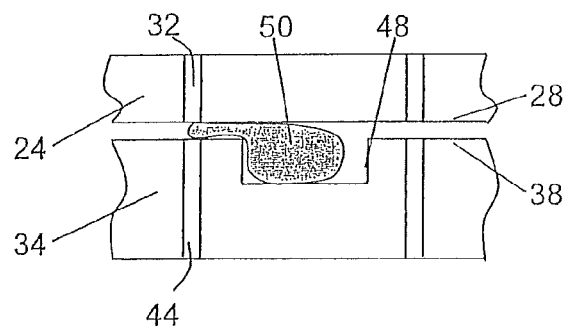
FIG. 9A  FIG. 9B
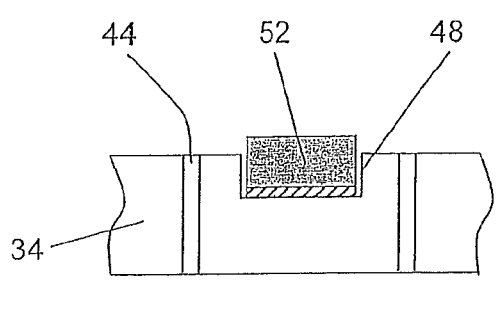
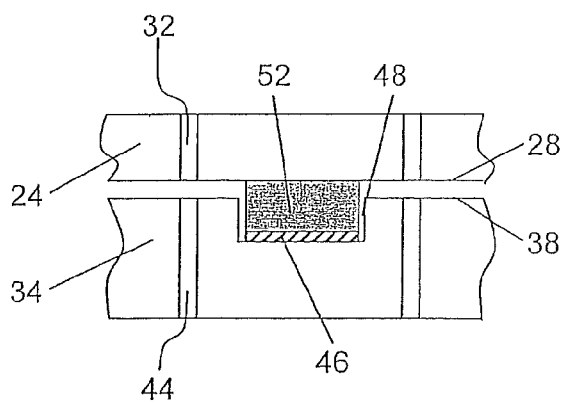
FIG. 10A  FIG. 10B

FILM ADHESIVE FOR SEMICONDUCTOR VACUUM PROCESSING APPARATUS

BACKGROUND

Semiconductor vacuum processing apparatuses such as plasma processing systems are used to process substrates by techniques including etching, physical vapor deposition (PVD), chemical vapor deposition (CVD), ion implantation, and resist removal. One type of semiconductor vacuum processing apparatus used in plasma processing includes a reaction chamber containing upper and bottom electrodes. An electric field is established between the electrodes to excite a process gas into the plasma state to process substrates in the reaction chamber.

In the field of semiconductor processing, vacuum processing chambers are generally used for etching and chemical vapor deposition (CVD) of materials on substrates by supplying an etching or deposition gas to the vacuum chamber and application of an RF field to the gas to energize the gas into a plasma state. Examples of parallel plate, transformer coupled plasma (TCP TM) which is also called inductively coupled plasma (ICP), and electron-cyclotron resonance (ECR) reactors and components thereof are disclosed in commonly-owned U.S. Pat. Nos. 4,340,462; 4,948,458; 5,200,232 and 5,820,723, which are incorporated herein by reference in their entirety. Because of the corrosive nature of the plasma environment in such reactors and the requirement for minimizing particle and/or heavy metal contamination, it is desirable for the components of such equipment to exhibit high corrosion resistance.

During processing of semiconductor substrates, the substrates are typically held in place within the vacuum chamber on substrate holders by mechanical clamps and electrostatic clamps (ESC). Examples of such clamping systems and components thereof can be found in commonly-owned U.S. Pat. Nos. 5,262,029 and 5,838,529, which are incorporated herein by reference in their entirety. Process gas can be supplied to the chamber in various ways such as by gas nozzles, gas rings, gas distribution plates, etc. An example of a temperature controlled gas distribution plate for an inductively coupled plasma reactor and components thereof can be found in commonly-owned U.S. Pat. No. 5,863,376, which is incorporated herein by reference in its entirety.

A plasma processing system wherein an antenna coupled to a radiofrequency (RF) source energizes gas into a plasma state within a process chamber is disclosed in commonly-owned U.S. Pat. No. 4,948,458, which is incorporated herein by reference in its entirety. In such systems, the antenna is located outside the process chamber and the RF energy is supplied into the chamber through a dielectric window. Such processing systems can be used for a variety of semiconductor processing applications such as etching, deposition, resist stripping, etc.

Aluminum and aluminum alloys are commonly used for walls of plasma reactors. In order to prevent corrosion of the walls, various techniques have been proposed for coating the aluminum surface with various coatings. For instance, commonly-owned U.S. Pat. No. 6,408,786 which is incorporated herein by reference in its entirety, proposes supporting a ceramic tiled liner by a resilient support member such as an elastomeric joint or an elastically bendable metal frame between each ceramic tile in the liner and the chamber sidewall.

With regard to plasma reactor components such as showerhead gas distribution systems, various proposals have been made with respect to the materials of the showerheads. For instance, commonly owned U.S. Pat. Nos. 5,569,356 and 5,074,356, which are incorporated herein by reference in their entirety, disclose a showerhead of silicon, graphite, or silicon carbide.

SUMMARY

In an embodiment, a bonded component assembly for use in a plasma processing apparatus for processing of semiconductor substrates is provided. The bonded component assembly comprises a support member having at least one load bearing surface to support a component. The component supported on the at least one load bearing surface has at least one surface exposed to a plasma. An elastomeric sheet adhesive joint between mating surfaces of the at least one load bearing surface and the component allows movement in a lateral direction of the component relative to the support member during temperature cycling due to mismatch of thermal expansion of the support member and the component.

In another embodiment, a method of joining an assembly for use in a plasma processing apparatus for processing a semiconductor substrate is provided, which includes applying a first surface of a sheet of uncured elastomeric adhesive to at least one load bearing surface of a support member in a predetermined pattern of regions to be bonded which exclude regions to remain unbonded. At least one bonding surface of a component is applied to a second surface of the uncured elastomeric sheet adhesive in a predetermined pattern of regions to be bonded, the component having at least one other surface to be exposed to the plasma. The at least one bonding surface of the component is bonded to the at least one load bearing surface of the support member by the elastomeric sheet adhesive therebetween to form the assembly.

Another embodiment provides a method of processing a semiconductor substrate with reduced particle contamination in a plasma processing apparatus. A substrate is placed on a substrate support in a reaction chamber of the plasma processing apparatus. A process gas is introduced into the reaction chamber with a composite showerhead electrode assembly, a gas ring or a gas injector and at least one component bonded to a support member by an elastomeric sheet adhesive joint. A plasma is generated from the process gas in the reaction chamber above the substrate, the component having at least one surface exposed to the plasma, and the substrate is processed with the plasma.

In another embodiment, a component assembly for reducing particle contamination during plasma processing semiconductor substrates is provided. The component assembly includes a support member of a plasma processing chamber having at least one load bearing surface to support a component. The component supported on the at least one load bearing surface has at least one surface to be exposed to a plasma. The component assembly includes an uncured elastomeric sheet adhesive to be cured in a joint between mating surfaces of the at least one load bearing surface and the component. The joint allows movement of the component relative to the support member due to mismatch of thermal expansion of the support member and the component after curing, wherein the sheet of elastomeric adhesive is a filled, heat-curable, unvulcanized elastomeric silicone sheet.

BRIEF DESCRIPTION OF THE DRAWINGS

FIG. 4 illustrates embodiments of a sheet adhesive having different coplanar properties.

FIG. 5 illustrates an embodiment of a sheet adhesive having elevation jogs.

FIG. 6 illustrates embodiments of sheet adhesive in various shapes.

FIG. 7 illustrates an embodiment of a sheet adhesive.

FIG. 9A illustrates a cross section portion of an embodiment of a support member supporting a bead of uncured paste or liquid adhesive prior to bonding;

FIG. 9B illustrates the cross section shown in FIG. 9A after the component is bonded to the support member with the paste or liquid adhesive.

FIGS. 10A and 10B illustrate a cross section portion of an embodiment of a component bonded to a support member with sheet adhesive.

DETAILED DESCRIPTION

Control of particulate contamination on the surfaces of semiconductor wafers during the fabrication of integrated circuits is essential in achieving reliable devices and obtaining a high yield. Processing equipment, such as plasma processing apparatuses, can be a source of particulate contamination. For example, the presence of particles on the wafer surface can locally disrupt pattern transfer during photolithography and etching steps. As a result, these particles can introduce defects into critical features, including gate structures, intermetal dielectric layers or metallic interconnect lines, resulting in the malfunction or failure of the integrated circuit component.

Reactor parts with relatively short lifetimes are commonly referred to as "consumables," for example, dry etch chamber upper electrodes and electrostatic chuck lower electrodes, optics tubes, gas injectors, and other vacuum chamber related parts, herein referred to as components. If the consumable part's lifetime is short, then the cost of ownership is high. Components used in dielectric etch tools deteriorate after a predetermined number of RF hours (time in hours during which radio frequency power is used to generate the plasma). Erosion of consumables and other parts generates particulate contamination in plasma processing chambers.

Component assemblies can be fabricated by bonding two or more dissimilar members with mechanically compliant and/or thermally conductive bonding materials, allowing for a multiplicity of function. The surfaces of components can be treated with a primer to enhance adhesion of the bonding material. To enhance electrical or thermal conductivity, the bonding material can contain electrically and/or thermally conductive filler particles. However, the primer and the filler particles associated with use of the bonding material can also be a potential source for particulate contamination. Additionally, because component assemblies can contain gas passages or other close tolerances, it is essential that the flow of the bonding material be controlled, such that the gas passages remain unobstructed by the bonding material. Methods for joining components of a plasma processing apparatus are provided that can reduce contamination originating from the bonding material and precisely control bonding material placement.

Figure 1A:
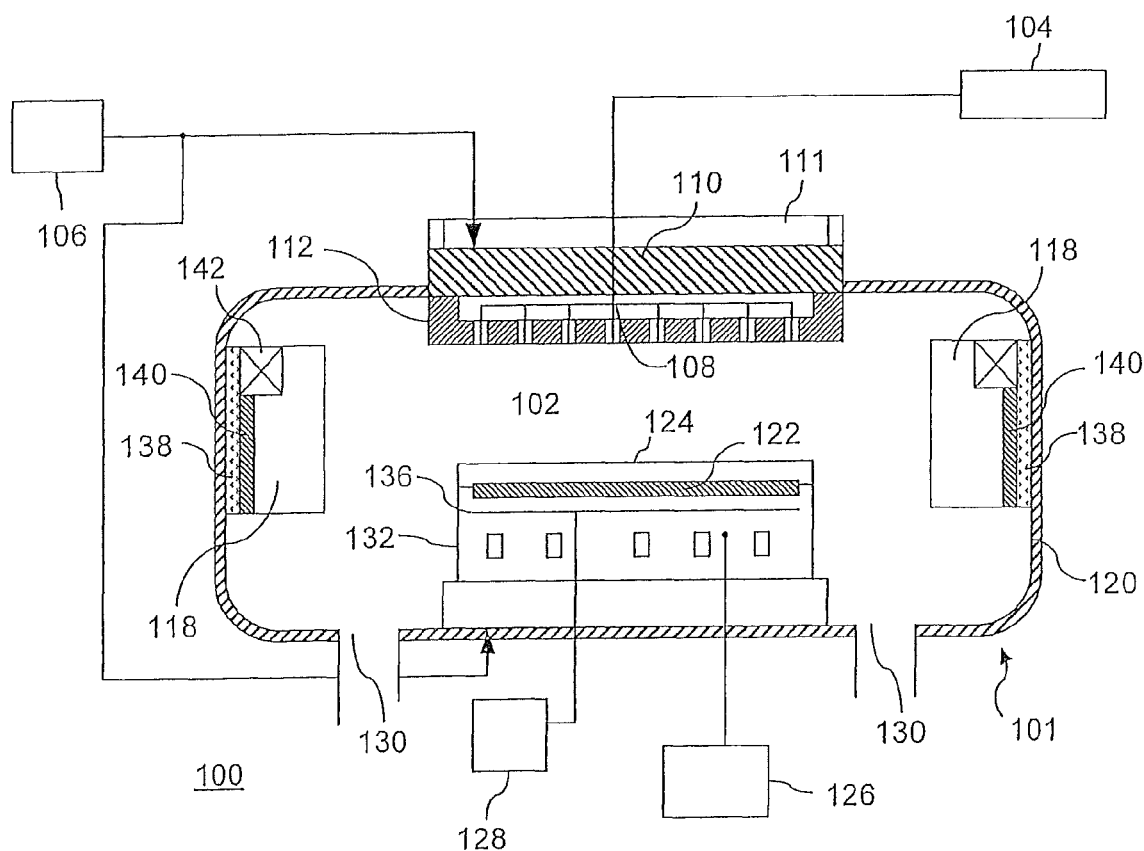
FIGS. 1A and 1B illustrate embodiments of reaction chambers in cross-sectional views showing ceramic and quartz vacuum parts and substrate supports for plasma processing apparatuses.
Figure 1B:
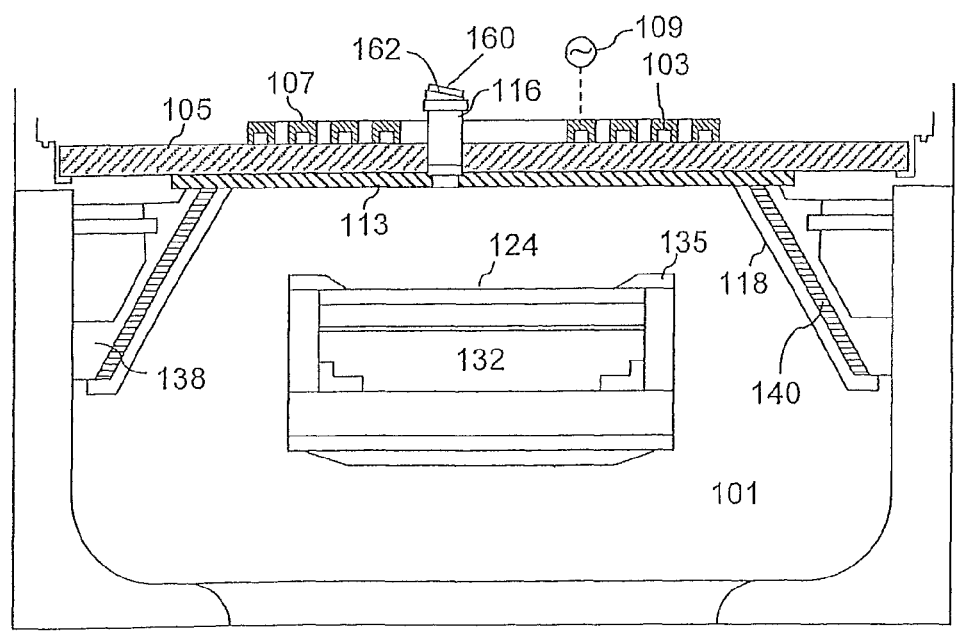

The component assemblies can be used in various plasma etch systems, such as the plasma etch systems illustrated in FIG. 1A and FIG. 1B. The plasma etch system illustrated in FIG. 1A comprises an electrode assembly 110 including an upper electrode 112 located in a parallel plate reactor system 100 having a chamber 101. The chamber 101 includes a lower electrode 132, which supports a single wafer substrate on its top surface. The electrode assembly 110 is mounted in an upper housing 111. The upper housing 111 can be moved vertically by a mechanism (not shown) to adjust the gap between the upper electrode 112 and the lower electrode 132. Optionally, the lower electrode 132 can be moved to adjust the gap and the upper electrode 112 can be fixed.

The plasma etch system illustrated in FIG. 1B includes a substrate holder 132 providing an RF bias to a substrate supported thereon and a mechanical clamp 135 for clamping the substrate while it is He backcooled. A source of energy for maintaining a high density (e.g. $10^{11}$-$10^{12}$ ions/cm$^3$) plasma in the chamber such as an antenna 107 powered by a suitable RF source and suitable RF impedance matching circuitry inductively couples RF energy into the chamber 101 so as to provide a high density plasma. The chamber includes suitable vacuum pumping apparatus for maintaining the interior of the chamber at a desired pressure (e.g. below 50 mTorr, typically 1-20 mTorr). A substantially planar dielectric window 105 of uniform thickness is provided between the antenna 107 and the interior of the processing chamber 103 and forms the vacuum wall at the top of the processing chamber 103. A gas distribution plate, commonly called a showerhead 113, is provided beneath the window 105 and includes a plurality of openings such as circular holes (not shown) for delivering process gas supplied by the gas supply to the processing chamber 103. However, the gas distribution plate 113 can be omitted and process gas can be supplied to the chamber by other arrangements such as gas rings, a gas injector, etc. The antenna 107, according to one embodiment, is provided with a channel 103 through which a temperature control fluid is passed via inlet and outlet conduits. However, the antenna 107 and/or window 105 could be cooled by other techniques such as by blowing air over the antenna and window, passing a cooling medium through or in heat transfer contact with the window and/or gas distribution plate, etc.

The substrate can enter the chamber through a load lock as described in commonly-assigned U.S. Pat. No. 6,899,109, which is hereby incorporated by reference in its entirety. Referring to FIG. 1A, a process gas source 104 is connected to the housing 111 to deliver etchant gas comprising one or more gases to the electrode assembly 110 through a process gas supply 108. A vacuum pump arrangement 130 maintains a desired vacuum in the chamber, e.g., 0.001 to 10 Torr. A temperature controller 126 is connected to the lower electrode 132 to maintain it at a desired temperature. For example, the lower electrode 132 temperature can be controlled with a temperature controller as described, for example, in commonly-owned U.S. Pat. Appln. Pub. No. 2004/0187787, which is incorporated herein by reference in its entirety. The temperature of the upper electrode can be controlled by a temperature controller as described, for example, in commonly-owned U.S. Pat. Appln. Pub. No. 2005/0133160, which is incorporated herein by reference in its entirety. A power source 106 provides radio frequency (RF) power to the upper and/or lower electrodes 112 and 132.

While a capacitively coupled system is shown in FIG. 1A and a system wherein an antenna coupled to a RF source energizes gas into a plasma state is shown in FIG. 1B, the chamber can have a modular design which allows various plasma generating sources to be mounted thereon. The chamber can be of any suitable material and according to a preferred embodiment, the chamber is formed out of a single piece of aluminum or an aluminum alloy.

FIGS. 1A and 1B illustrate exemplary embodiments of component assemblies for a plasma processing apparatus in which semiconductor substrates, e.g., silicon wafers, are processed. Each component assembly comprises a component secured to a support member. In embodiments of the component that include multiple-segments, the segments preferably have edges that overlap each other to protect an underlying bonding material from exposure to plasma as described, for example, in commonly-owned U.S. Pat. Appln. Pub. Nos. 2004/0092120 and 2007/0187038, which are incorporated herein by reference in their entirety. The components can comprise a chamber liner 118 secured to a support member 138 or secured to a chamber wall 120. The chamber liner 118 can have a resistance heater 142 embedded therein. The components can comprise an optics window 160 secured to an optics tube 116, for example, the optics tube 116 can be mounted off-center through the TCP dielectric window 105 shown in FIG. 1B. The components can also comprise an electrostatic chucking device 124 secured to the lower electrode 132 as a support member. The components can also comprise other parts not shown in the illustration for use in a plasma processing apparatus, for example, segmented shield rings around upper electrodes or lower electrodes.

Ceramic, quartz, and silicon (e.g., single crystal and polycrystalline silicon and compounds such as silicon carbide and silicon nitride) are preferred materials for plasma exposed surfaces of the components in the component assemblies. For example, yttria ($Y_2O_3$) can be used for plasma exposed surfaces as described in commonly-assigned U.S. Pat. No. 7,220,497, which is incorporated herein by reference in its entirety. Support members such as chamber walls 120 are preferably made of aluminum and aluminum alloys.

The component and support member are preferably made of a material that is chemically compatible with process gases used for processing semiconductor substrates in the plasma processing chamber, and is electrically and/or thermally conductive. Exemplary suitable materials that can be used to make the support member include aluminum, aluminum alloys, graphite, a dielectric, a semiconductor and SiC. A preferred material for a support member is aluminum alloy 6061 which has not been anodized on the portion thereof bonded to the compound.

The component 116/118/124 can be attached to the support member 120/138/132 with a suitable thermally and/or electrically conductive elastomeric bonding material that accommodates thermal stresses, and transfers heat and/or electrical energy between the component and the support member. The use of elastomers for bonding together surfaces of an electrode assembly is described, for example, in commonly-owned U.S. Pat. No. 6,073,577, which is incorporated herein by reference in its entirety.

In an embodiment the elastomeric joint is an elastomeric sheet adhesive. The sheet adhesive can be any suitable elastomeric material such as a polymer material compatible with a vacuum environment and resistant to thermal degradation at high temperatures such as above 200° C. The elastomeric material can optionally include a filler of electrically and/or thermally conductive particles or other shaped filler such as wire mesh, woven or non-woven conductive fabric. Polymeric bonding materials which can be used in plasma environments above 160° C. include polyimide, polyketone, polyetherketone, polyether sulfone, polyethylene terephthalate, fluoroethylene propylene copolymers, cellulose, triacetates, silicone, and rubber.

Preferably, the sheet adhesive is a thermally conductive silicone adhesive bonding an aluminum support member to a ceramic or quartz component. Preferably, the adhesive withstands a high shear strain of at least 500% (for example, 500 to 900%, 500 to 800%, 500 to 700% or 500 to 600%) in a temperature range from room temperature to 180° C. or higher (for example, between room temperature and 300° C.). Also preferably, the adhesive withstands a high shear strain of at least 800% (for example, 800 to 900% or 800% to 850%) in a temperature range from room temperature to 180° C. or higher (for example, room temperature to 300° C.). The adhesive can require on the order of 50 to 300 psi (for example, 50-100 psi, 100-150 psi, 150-200 psi 200-250 psi or 250-300 psi) shear stress to achieve 500% strain (at room temperature to 180° C. or higher). Preferably, the adhesive requires on the order of 50 to 300 psi shear stress to achieve 800% strain (at room temperature to 180° C. or higher). For example, the adhesive can require 50-100 psi, 100-200 psi, or 200-300 psi shear stress to achieve 800% strain (at room temperature to 180° C. or higher). Most preferably, the adhesive can require on the order of 225-275 psi shear stress to achieve 600-800% strain (e.g. 600-700% or 700-800%) (at room temperature to 180° C. or higher). It is preferred that the adhesive exhibits a linear shear stress/strain curve up to at least 500% or up to at least 800% in the temperature range from room temperature to 180° C. or room temperature to 300° C., however nearly linear is also preferred. Also preferably, the adhesive has the lowest possible shear stress at its ultimate failure, for example, less than or equal to 250 psi shear stress at 800% strain (in the temperature range from room temperature to 180° C. or room temperature to 300° C.).

Preferably, the sheet adhesive exhibits a linear shear stress/strain curve up to at least 500% or up to at least 800% in the temperature range from room temperature to 180° C. or room temperature to 300° C., from a shear stress of 50 to 300 psi after about 5,000 cycles of heating the bonded component assembly from room temperature to 250° C.

When the aluminum support member and silicon, ceramic or quartz component thermally expand at different rates, the adhesive used to bond the two parts together couples the loads between the two parts. In contrast, when the adhesive is soft (low shear stress at a given strain according to an embodiment), the two parts will not induce stresses or diaphragm deflections into each other. Preferably, the support member and component have a gap between non-bonded areas of the two mating surfaces. Diaphragm deflections can cause non-bonded areas of the support member surface to contact and rub along non-bonded areas of the component surface during thermal expansion of the two parts. Such rubbing can cause galling and wear particles off of one or both surfaces. Thus, when the adhesive is soft, less particulate contamination is generated due to little or no diaphragm deflection and less relative rubbing from part distortion due to mismatching coefficients of thermal expansion.

The sheet adhesive can be formulated with high molecular weight dimethyl silicone and optional fillers, or it can also be matrixed around fiberglass screen (scrim), metallic screen, or mixed with glass microbeads and/or nanobeads of glass or other material to accommodate requirements of various applications. Preferably, the sheet adhesive is formulated with high molecular weight dimethyl silicone matrixed around $Al_2O_3$ microbeads. Composite layers of sheet adhesive can be produced and laminated which have different physical properties. In a preferred embodiment, areas of the sheet adhesive can be discretely formulated with different physical properties. Examples of physical properties are thermal conductivity, elasticity, tensile and shear strength, thickness, thermal coefficient of expansion, chemical resistance, particle erosion, and service temperature range.

For example, filled elastomer material may be subject to plasma erosion and has the potential of releasing conductive filler particles during plasma processing. During plasma processing, ions or radicals may migrate into passages or gaps causing the erosion of the filled elastomer material at the joint interface around the passages or gaps. For example, aluminum alloy filler particles which originate from plasma eroded elastomer material can deposit on the wafer to produce defects during the etching process. In an embodiment for reducing the release of conductive filler particles, areas of the sheet adhesive can be discretely formulated with different filler particle densities. For example, areas of the sheet adhesive in the joint interface exposed to ions or radicals that have migrated through passages or gaps can be unfilled (filler particle free) while other areas of the sheet adhesive not exposed to the ions or radicals can include filler particles. Optionally, the areas of the sheet adhesive discretely formulated to have different physical properties can be coplanar.

Preferably, the high purity elastomeric material of the elastomeric sheet adhesive is a heat curable thermally conductive silicone based on a diphenyl dimethyl silicone copolymer. For example, the elastomeric sheet adhesive is formulated from a thermally conductive room temperature unvulcanized silicone sheet under the trade name CV-2680-12 available from NUSIL TECHNOLOGY. Preferably, the silicone sheet adhesive product uses an $Al_2O_3$ filler and is formulated to be heat curable, that is, preferably, the sheet adhesive does not require a separate activator application to initiate a cross-linking reaction. Preferably, the sheet adhesive is formulated with a suitable heat activated component to perform the cross-linking reaction at a predetermined curing temperature, for example, the heat activated cross-linking agent can be a peroxide. An example of one such formulated adhesive sheet is HCR-9800-30, available from NUSIL TECHNOLOGY.

In the case where the elastomer is an electrically conductive elastomer, the electrically conductive filler material can comprise particles of an electrically conductive material. Potential electrically conductive materials for use in the impurity sensitive environment of a plasma reaction chamber are nickel coated carbon powder, nickel powder, carbon nanotubes, graphene, graphite and a combination thereof.

In the case where the elastomer is a thermally conductive elastomer, the thermally conductive filler material can comprise particles of a thermally conductive metal or metal alloy. A preferred metal for use in the impurity sensitive environment of a plasma reaction chamber is an aluminum alloy, aluminum oxide ($Al_2O_3$) or boron nitride (BN). Preferably the elastomeric sheet adhesive has a low strength, can withstand a high shear strain and has a high thermal conductivity. Preferably, the thermal conductivity is at least 0.2 W/mK, more preferably at least 1.0 W/mK and most preferably at least 1.5 W/mK (e.g., 0.2-2.0 W/mK, 0.75-1.5 W/mK). A more uniform distribution of thermal and/or electrical conductor particles can be achieved in an elastomeric sheet adhesive than in a liquid or paste elastomeric bonding material.

In order to stay within the elastic limits of the finally formed joint, a suitable bond thickness can be used. That is, too thin of a sheet adhesive joint could tear during thermal cycling whereas too thick a sheet adhesive joint could reduce the thermal conductivity between the parts to be joined. It is not necessary to use an electrically and/or thermally conductive elastomer since sufficient RF power can be supplied, if needed, through a thin area of the elastomeric joint due to capacitive coupling.

Figure 2A:
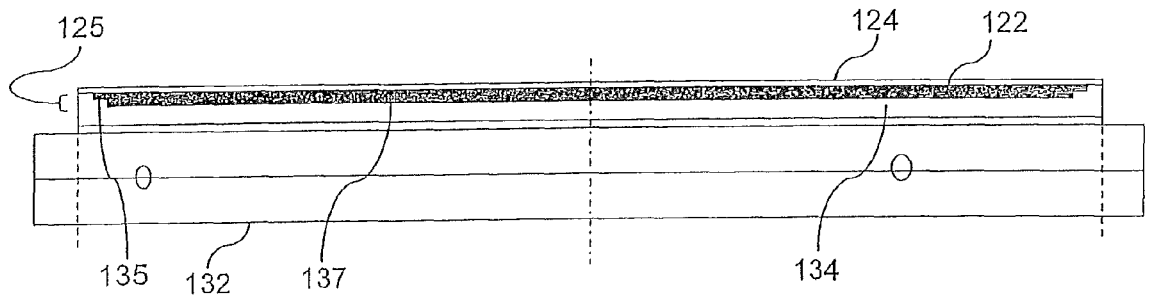
FIGS. 2A-2D are side views of an embodiment of a lower electrode, illustrating an application of an elastomeric sheet adhesive between a lower electrode and a substrate support.
Figure 2B:
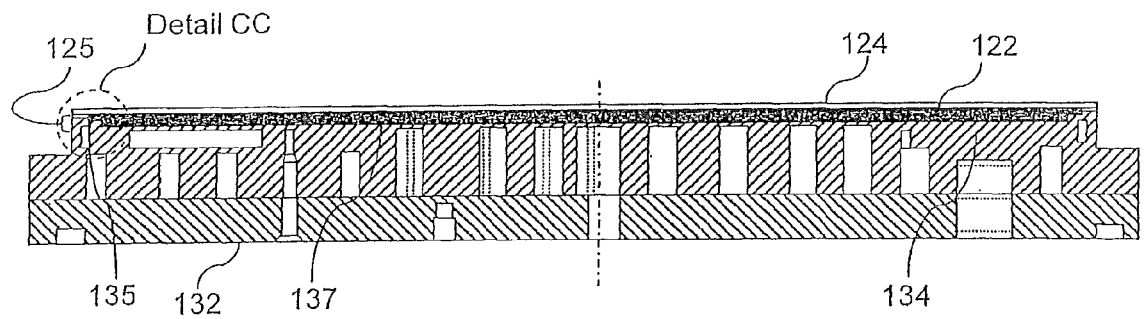
Figures 2C, 2D:
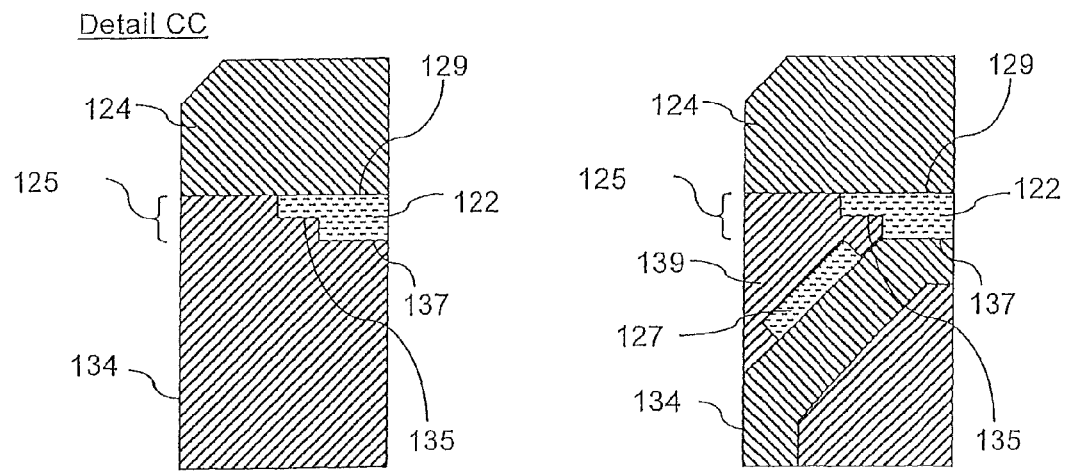

FIGS. 2A-2C show an embodiment of an electrostatic chucking device bonded to a lower electrode. In the illustrated embodiment, the support member comprises an electrode 132 and intermediate layer 134. The component comprises a substrate support 124 attached to the support member intermediate layer 134 by a bonding material 122. The intermediate layer 134 can comprise temperature control channels and the electrostatic chucking device 136 connected to a clamping power supply 128. Such a support member is not particularly limited and may comprise a dielectric or semiconductor body having the electrostatic chucking device 136, the intermediate layer 134, and/or the lower electrode 132 embedded therein.

FIGS. 2A-2C show an embodiment where a recess 135 is located in the support member intermediate layer 134 having a flat sheet of adhesive 122 located therein to bond the mating surfaces of the substrate support 124 and the support member intermediate layer 134. FIG. 2C shows a detailed view of the upper edge of the support member shown in FIG. 2B. The embodiment in FIG. 2C shows a recess 135 having a greater depth 137 to accept the flat sheet adhesive 122 having an elevation jog 125. Such an elevation jog 125 allows, for example, the flat sheet adhesive 122 with a thicker portion to accommodate greater shear strain at a periphery of the substrate support 124 to support member intermediate layer 134 joint without tearing of the elastomer or diaphraming of the members. In another embodiment shown in FIG. 2D, an outer protective ring 139 can be bonded to the support member intermediate layer 134 by a single conical ring of sheet adhesive 127 in a recess in the outer protective ring 139.

The mating surfaces of the component and support member can be planar or non-planar. For instance, one mating surface can be planar and the other can include a non-planar recess for receiving the sheet adhesive bonding material. Referring to FIGS. 2A-2C, the lower surface of the substrate support 124 is planar and the upper surface of the support member intermediate layer 134 is non-planar, having a step between planes 135 and 137. Alternatively, the mating surfaces can be contoured to provide an interlocking and/or self-aligning arrangement.

Figure 3A:
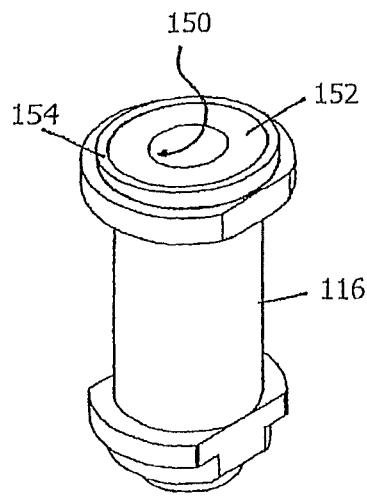
FIGS. 3A-3E show an embodiment of a component assembly comprising an optics tube.
Figure 3B:
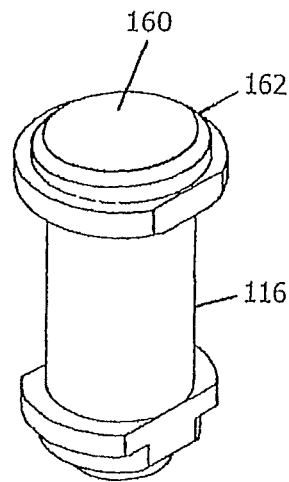

FIG. 3A illustrates an embodiment of an optics tube 116. The optics tube 116 is a hollow tube with an inner diameter 150 in communication with the vacuum chamber (Refer to FIGS. 1A and 1B), for example, made of quartz. A window seat 152 and a support rim 154 around the periphery of the window seat 154 support an elastomeric adhesive sheet for bonding the window to the optics tube 116. FIG. 3B shows the window 160 bonded to the optics tube 116 by a filleted ring of elasomeric sheet adhesive 162. The window 160 can be a material such as sapphire. The window 160 is preferably, between 4 and 55 mm in diameter (e.g., 5, 10, 13, 20, 25, 40, 51 mm) and 0.75 to 3 mm thick (e.g., 1 or 2 mm).

Figure 3C:
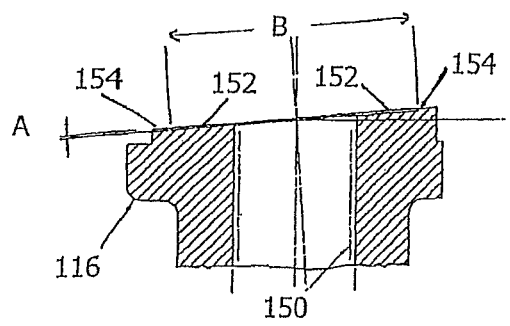
Figure 3D:
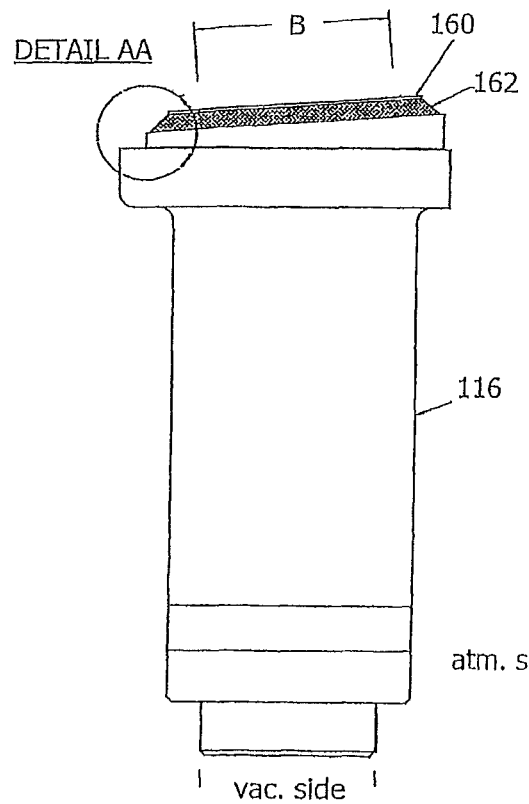
Figure 3E:
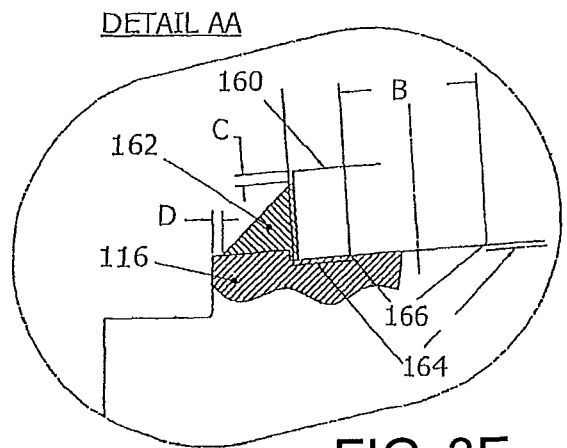

FIG. 3C shows a partial cross section of the optics tube 116 before the window 160 is bonded to the window seat 152. FIG. 3D shows a side view of the optics tube 116 with the window 160 bonded to the optics tube 116 by the filleted ring of elastomeric sheet adhesive 162. The Detail AA of FIG. 3D is shown in FIG. 3E, which shows a partial cross section view of an upper portion of the optics tube 116 where the window 160 is bonded to the window seat 152 and support rim 154. The elastomeric sheet adhesive 162 bonds to a side portion of the window 160 and a bottom portion. The elastomeric sheet adhesive bonds the bottom of the window 160 to the window seat 152 in bonding region 164. Unbonded region 166 adjacent bonded region 164, borders the optics tube 116 inner diameter surface 150. Use of the elastomeric sheet adhesive allows precise placement in the bonding region 164 without contaminating the unbonded region 166.

In order to enhance adhesion of the elastomeric bonding material, the mating surfaces are preferably coated with a suitable primer. When the bonding material is formulated from the NUSIL TECHNOLOGY HCR-9800-30 material described above, the primer can be silicone primers under the trade name SP-120 or SP-270 manufactured by NUSIL TECHNOLOGY. Preferably, such primer is applied to the mating surfaces and dried prior to placing the sheet adhesive on the surface locations to be bonded.

The primer can be applied as a thin coating by any suitable technique such as wiping, brushing, spraying, over discrete bonding surfaces of the components and/or support members to create bonding sites for the later applied bonding material. If the primer contains a solvent, application of the primer by wiping can enhance bonding by cleaning the surfaces. A siloxane containing primer reacts with air and creates silicon bonding sites when cured in air at room temperature. Such primers provide a visual indication of the amount of bonding sites with excessive primer locations appearing powdery.

The sheet adhesive is preferably between transfer sheets for handling. Preferably the transfer sheets are TEFLON manufactured by DUPONT. Transfer sheets are preferred to prevent, for example, deformation and damage to the uncured sheet adhesive. The sheet adhesive is applied to the mating surfaces or primed mating surfaces by removing one transfer sheet and applying the exposed surface of the adhesive sheet to a first mating surface, removing the other transfer sheet and applying a second mating surface to the other exposed surface of the adhesive sheet. The adhesive sheet surface can be tacky and preferably, tooling can be used to precisely remove the transfer sheets and place the sheet adhesive on the mating surfaces. Also preferably, the adhesive sheet on the mating surface can be placed under a vacuum to draw out any gaps under the adhesive and apply a temporary seating load, such as by vacuum bagging.

After the sheet adhesive bonding material is applied to at least one of the surfaces, the parts can be assembled such that the surfaces are pressed together under compression such as under a static weight or by atmospheric pressure within a vacuum bag. Since the elastomer is in the form of a sheet adhesive it is not necessary to apply an initial slight pressure such as hand pressure to spread the elastomer throughout the joint to be formed. However a slight pressure such as hand pressure or alternatively, a light atmospheric load within a vacuum bag is required to seat the adhesive to the mating surfaces. After approximately five minutes or less of seating load, it is preferred to remove all loading on the adhesive. The curing should preferably be performed without any significant static weight or vacuum bag loads. The bond can be cured at elevated temperature in an atmospheric or protective gas environment. The assembly can be placed in a convection oven and heated to activate the crosslinking process of curing the bond. For example, a heat curable bond material can be treated at a primary cure temperature of between 110° C. and 122° C. (e.g., 116° C.) for 10 to 20 minutes (e.g., 15 minutes). Upon successful inspection of the assembly, the bond material can be treated at a secondary cure temperature of between 140° C. and 160° C. (e.g., 150° C.) for 1.5 to 2.5 hours (e.g., 2 hours). Optionally, only the secondary cure is applied for 2.5 to 3.5 hours (e.g., 3 hours), skipping the primary cure.

Preferably, the sheet adhesive maintains its geometric shape such that the sheet adhesive does not bulge or flow during bonding and curing. However, the sheet adhesive volume change during curing can be up to 5%. Preferably, the sheet adhesive undergoes no more than 2 to 3% volume shrinkage during curing.

During plasma processing, the elastomer bonded component assemblies are able to sustain high operation temperatures, high power densities, and long RF hours. Also, the use of sheet adhesive elastomer materials as a mechanism for joining component assemblies has additional advantages over non-sheet adhesives during plasma processing of semiconductor wafers.

Regions of the components with residual unused primer (unbonded areas) can be a source of contamination. For example, the use of siloxane primers (e.g., RHODIA SILICONES VI-SIL V-06C) has been determined to have potential to introduce levels of contamination, including titanium. The titanium contaminants may potentially react with the silicon substrate, forming titanium silicides in undesired regions of the substrate during the etching process.

A sheet adhesive allows reducing contamination originating from the primer material by selectively applying the primer to regions on the component assembly (e.g. joining component 118 with support member 138) where sheet adhesive bonding material will be subsequently applied, rather than broadly coating all surfaces with the primer. The sheet adhesive allows precise placement of the elastomer over the primed surfaces reducing the margin of error or uncertainty in elastomer placement which in turn allows a more precise and frugal application of primer.

As a preferred embodiment the sheet adhesive can be a composite single layer or composite stacked layers of flat rings of various planar width having one or more different physical properties in a thickness direction (laminated) or a planar direction (co-planar). FIG. 4 shows a portion of a flat ring sheet adhesive 122 having different co-planar physical properties. For example, inner portion 62 and outer portion 64 can be unfilled silicone elastomer sheet adhesive for low particulate contamination release and middle portion 66 can contain $Al_2O_3$ particles for thermal conductivity.

FIG. 5 shows an embodiment of a sheet adhesive 123. The sheet adhesive 123 may be a plurality of flat circular or semi-circular rings of various widths having elevation jogs 68 (small steps). Surfaces 70 and 72 may bond to recesses in a component mating surface (not shown, but similar to recesses 135 and 137 in support member intermediate layer 134) or surface 70 may bond to a component mating surface without recesses such as the chamber liner 118 mating surface. Surfaces 74 and 76 may bond to recesses in a support member intermediate layer 134 mating surface similar to recesses 135, 137 or surface 76 may bond to a support member without recesses such as chamber liner support member 138 in FIG. 1A.

By way of example, the sheet adhesive can be arranged as an uniform or non-uniform pattern of dots, triangles, columns and other geometric shapes of various widths and thicknesses without limitation. FIG. 6 shows cones 206, rectilinear strips 208, triangles 210, circular dots 212 and circular dots having elevation jogs 214 of sheet adhesive. The sheet adhesive can be a plurality of such geometric shapes to bond the bonding regions on the mating surfaces of the component and support member. However, in another embodiment the sheet adhesive can be a single sheet having a "spider web" geometric shape to precisely match to bonding regions while leaving unbonded regions. Regions can be left unbonded, for example, for gas passages, bolt holes or lifting pins. FIG. 7 shows an embodiment of a single sheet 122 in plan view for bonding, for example, mating surfaces of substrate support component 124 and support member intermediate layer 134. Accordingly, spaces 78 in the sheet adhesive 122 can correspond to unbonded regions. In this embodiment such unbonded regions would correspond to greater than 80% of the mating surface area.

Figure 8:
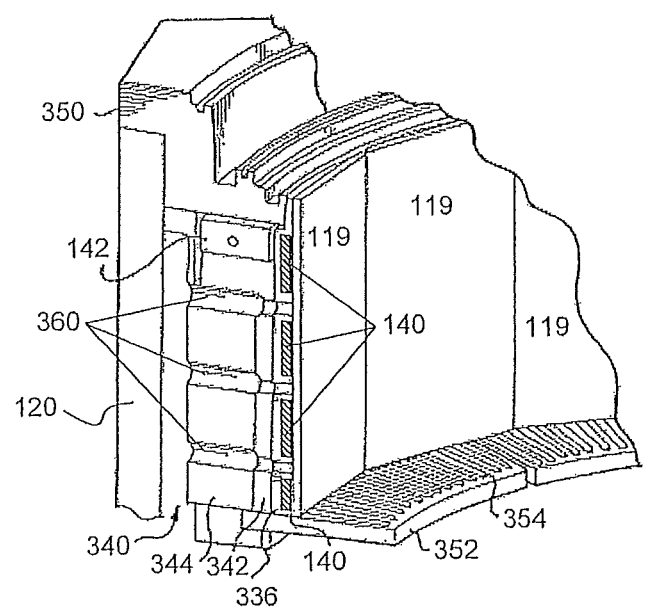
FIG. 8 illustrates an embodiment of a plasma processing chamber component bonded to a support member with an elastomeric sheet adhesive.

FIG. 8 shows an embodiment where the component assemblies comprise a chamber liner component and a chamber liner support member. The chamber liner 118 can be comprised of tiles 119. The tiles 119 can be, for example, quartz, SiC, silicon nitride, yttria containing ceramic, silica, etc. A plasma screen 352 for confining the plasma in the space surrounding a wafer on the substrate support 124 extends inwardly from the lower end of the liner 118. In the embodiment shown in FIGS. 1A and 1B, the liner 118 is supported by a support member 138 which can include an elastically bendable frame of an inner support frame and an outer support frame. In order to maintain the liner at a desired temperature during processing of a substrate, a heater 142 is provided at the top of the support member 138. In operation, the heater 142 is effective to heat the liner 118 and removal of heat from the liner 118 can be accomplished by a temperature controlled member 350 which withdraws heat from the liner through the inner and outer frames. Other types of heating arrangements such as a heater embedded in the liner or suitable radiant heating arrangements can also be used. Details of a suitable radiant heater are disclosed in commonly owned U.S. Pat. No. 6,227,140, the entire content of which is hereby incorporated by reference.

In the embodiment shown in FIG. 8, the plasma chamber liner 118 comprises interlocking ceramic liner elements such as flat tiles 119. To provide an electrical ground path for the plasma, the tiles 119 are preferably of an electrically conductive material such as silicon or silicon carbide. Such a material provides an added benefit in that it does not contain aluminum and thus reduces Al contamination of processed substrates. According to a preferred embodiment, SiC tiles are bonded to aluminum backing plates 336. A preferred bonding material is an electrically conductive elastomer sheet adhesive 140 which can absorb lateral stresses caused by different thermal expansion coefficients of the SiC and Al. Each tile and backing plate assembly can be attached to the chamber wall by an elastically bendable frame 340 which includes an inner frame 342 and an outer frame 344. Temperature control of the liner is achieved by a heater 142 supplied power by electrical leads and a temperature controlled member 350.

In this embodiment, the sheet adhesive elastomeric material can be applied as continuous annular zone patterns 140 between regions containing passages 360. However, prior to applying the elastomeric material, primer can be applied in the same annular zones pattern corresponding to the elastomeric material. Such passages 360 can be bolt holes or filled with a heat transfer gas to contact an outer surface (backside) of the tiles 119 for temperature control.

While the sheet adhesive is shown as applied in annular zones, the pattern of applying sheet adhesive is not limited and can be applied in other patterns such as zones which are not annular. Sheet adhesive can be cut in predetermined patterns and portions removed from the transfer sheet to allow transfer of discrete sections of the sheet adhesive to the parts to be joined.

The primer can be applied to the outer surface of the tiles 119 in a predetermined pattern of bonding regions, surrounded by unbonded regions. In one example, the primer can be applied in patterns with a dispenser (e.g., a felt-tip dispenser) by contacting one or more outlets of the dispenser at a single position or multiple positions relative to a reference point, generating one or more zones at a time. In another example, the predetermined pattern can be applied by covering the outer surface of the tiles 119 with a mask having openings in the predetermined pattern. The primer may be applied in any appropriate predetermined pattern (e.g., a plurality of discrete zones, radial and/or discontinuous annular zones), as long as the primer is applied only to regions underlying the sheet adhesive elastomer material. The primer can also be applied by wiping, brushing, spraying through the openings of the mask. Both of the above described methods can also be used for applying primer to the load bearing surface of the support member 138. In applying the primer to only selected regions underlying the sheet adhesive elastomeric material, contaminants associated with the application of the primer can be significantly reduced.

Examples of mask materials can include KAPTON®, a polyimide-based material, MYLAR®, a polyester-based material, or TEFLON®, a fluoropolymer resin, all available from DU PONT.

The sheet adhesive has additional advantages over liquid, gel and paste adhesives. For example, as shown in FIGS. 9A and 9B, when the component assembly parts to be joined contain passages 32 and/or 44 (that is, component 24 may have passages 32 and/or support member 34 may have passages 44), the flow of liquid or paste uncured elastomeric material 50 must be controlled when the components are pressed together before the elastomer is cured. Passages 32 and 44 can be bolt holes, gas passages, lift pin openings, expansion joints, etc. When the uncured paste 50 is applied between two components and pressed, it is difficult to control the flow of the uncured elastomer material. As shown in FIG. 9B, the uncontrolled flow of the uncured elastomeric material 50 can result in the obstruction or blockage of the passages 32 and/or 44. As a result, additional cleaning or machining can be required to clear the obstructed or blocked passages 32 and/or 44. The sheet adhesive elastomeric material can avoid such problems since the sheet adhesive 52 can be placed between the component assembly parts to be joined with much finer tolerances than a liquid or paste elastomeric material as shown in FIG. 10A. The sheet adhesive can be configured to exhibit good volume control so as to not ooze or flow into undesired areas. As such, the sheet adhesive elastomeric material 52 can be located closer than the liquid, paste or gel, to the passages 32/44 without risk of obstruction or blockage of the passages 32/44.

When the component 24 and the support member 34 are composed of materials with different coefficients of thermal expansion, the thickness of the elastomer material can be varied to accommodate the differences in thermal expansion. For example, in FIG. 8, the tile 119 can be silicon and the backing plate 336 can be metallic (e.g., aluminum, stainless steel, copper, molybdenum, or alloys thereof). However, if two components with greater differences in thermal expansion coefficients are bonded (i.e., aluminum and silicon), upon heating during temperature curing or during operation of the electrode, a non-uniform shear stress is generated in the elastomeric bonding material, due to the different rates of thermal expansion. For example, referring to FIG. 2A, if a circular aluminum support member 134 is concentrically bonded to a circular electrostatic chucking laminate 124, the shear stress in the elastomeric bonding material near the center of the support member 134 and substrate support 124 is minimal at an elevated processing temperature. However, the outer portion of the aluminum support member 134 undergoes a larger amount of thermal expansion than the outer portion of the electrostatic chucking laminate 124. As a result, when the two materials are bonded, the maximum shear stress occurs in the outer peripheral edge of the support member 134 or top laminate 124, where the difference in thermal expansion is greatest.

The embodiments of FIGS. 10A and 10B illustrate an approach for reducing the complexities associated with the use of elastomer materials as a mechanism for joining component assemblies. FIG. 10A shows an embodiment of the sheet adhesive 52 bonded to a recess 48 in the load bearing surface of the support member 34 between passages 44. FIG. 10B shows the sheet adhesive 52 bonded to the load bearing surface 38 of the support member 34 and the bonding surface 28 of the component 24 between passages 32/44.

Adhesive in a sheet form can provide exceptional bond thickness control to precisely control parallelism of bonded surfaces over large areas such that inserts or spacers are not required to control bond thickness or parallelism. The sheet form allows exceptional volume control to limit or prevent oozing of adhesive into unwanted areas. The application of the sheet adhesive obviates need for precision dispensing equipment used to apply a liquid or paste adhesive. Issues with feed speeds of automated and/or manual dispensing procedures, and associated drying, necking or globing of adhesive dispense beads are thus eliminated. The sheet adhesive has more uniform suspension of thermal conductivity filler, better shelf life, and/or can provide a more efficient and reliable manufacturing process.

Preferably, the sheet adhesive can be cut into pre-form shapes, by, for example, laser, water jet, die cut, plotter cutting and other cutting methods. The sheet adhesive can also be cast into pre-form shapes by, for example, casting such as mold casting or rolling.

Figure 11:
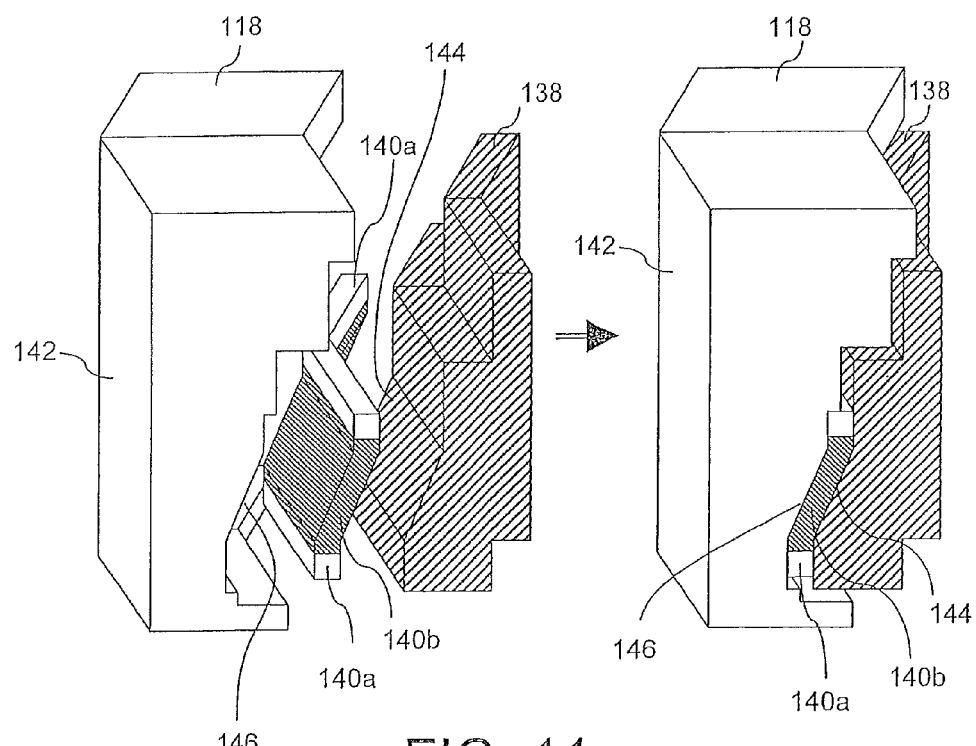
FIG. 11 illustrates a portion of an embodiment of a plasma processing chamber component before and after bonding to a support member with a sheet adhesive.

Preferably, the sheet adhesive is cut, handled and transferred as laminates between transfer sheets of TEFLON (not shown). FIG. 11 shows a perspective view of a sheet adhesive 140a/140b positioned between a recess in the bonding surface 146 of component 118. Such recesses can be in any form such as the form of racetrack grooves. Also shown, the sheet adhesive has portions 140b and portions 140a such that portions 140a can be unfilled silicone elastomer sheet adhesive for low particulate contamination release and middle portion 140b can contain $Al_2O_3$ particles for thermal conductivity and/or particles for electrical conductivity. Sheet adhesive 140a/140b has elevation jogs such that the sheet can fit between mating surfaces of the component 118 and the support member 138. The mating surfaces are the bonding surface 146 on the component 118 and the load bearing surface 144 of the support member 138. The bonding surface 146 refers to a surface in a direction away from process gas in a plasma state. The component also has at least one inner surface 142 exposed to plasma.

The recesses 48 in mating surface 38 can be located to precisely control the bonded and unbonded regions. The unbonded regions can be 1 to 95% of the surface area of the mating surface 38. For example, the unbonded region can be 1-5%, 5-10%, 10-15%, 15-20%, 20-30%, 30-40%, 40-50%, 50-60%, 60-70%, 70-80%, 80-90%, or 90-95% of the surface area of the mating surface 38. The passages 44 are in the unbonded regions and the sheet adhesive bonds the bonded regions. Optionally, the component and/or the support member can be free of passages. A distance between an edge of a sheet adhesive, for example, a flat ring 52 inner or outer diameter and a passage 44 opening in surface 38 can be precisely controlled to optimize bond properties and as previously mentioned, eliminate risk of blockage of passages 44 by oozing or bulging of a non-sheet elastomeric adhesive. Preferably, the sheet adhesive essentially maintains its original size and maintains the same shape before, during and after curing with little or no shrinkage, for example, 2-3% volumetric shrinkage after curing.

In FIG. 9A, the bead of liquid or paste adhesive 50 contacts the support member 34 along a curved surface of the bead 50 shown in cross section in recess 48. The contact area between the bead 50 and the mating surface of the support plate 38 is narrower than the bead 50 and difficult to control uniformity and reproducibility of the bond. In FIG. 9B, when the component 24 is mated to the support member 34 the contact between the liquid or paste adhesive bead 50 and the mating surfaces of the support member and the component 38/28 is limited and difficult to control such that the contact area may be less than the diameter of the bead 50, requiring an excess of liquid or paste adhesive to achieve a desired contact area for suitable bond strength and thermal and/or electrical conductivity between the support member 34 and the component 24. Excess elastomeric adhesive may interfere with thermal and/or electrical conductivity between the component 24 and the support member 34.

In FIG. 10A, the elastomeric sheet adhesive 52 precisely contacts the support member 34 along a predetermined surface of the adhesive sheet shown in cross section in recess 48 parallel to the support member surface. The contact area between the adhesive sheet 52 and the mating surfaces 38/28 of the support member 34 and the component 24 provides a maximum ratio of contact area to volume of elastomeric adhesive as shown in FIG. 10B. The greater contact area of the sheet adhesive 52 allows for less elastomeric sheet adhesive 52 to be used in a bond compared to liquid/paste adhesive to achieve suitable thermal and/or electrical conductivity, bond strength and bond elasticity between the support member 34 and the component 24.

Before curing, the sheet adhesive preferably has a physically stable nature. The sheet adhesive before curing is an unvulcanized, uncross-linked composition having dimensional stability. The uncured sheet adhesive can be malleable. As mentioned, transfer sheets are preferred for handling the uncured sheet adhesive to prevent deforming the sheet adhesive before curing. Upon heating, a cross-linking agent such as a peroxide filler preferably cures the sheet adhesive in the overall same shape as the uncured sheet adhesive. After curing, the sheet adhesive returns to the same shape after mechanical forces are removed. Greater contact area control increases thermal and/or electrical conductivity between the adhered parts. The cured sheet adhesive also maintains comparable elasticity at high volumes of filler particles to that of the cured gel elastomers and greater elasticity at high volumes of filler particles than the cured liquid and paste elastomers. By using high volumes of filler particles in the elastomeric sheet adhesive greater thermal and/or electrical conductivity can be achieved between the adhered parts for a given volume of elastomeric adhesive without sacrificing bond strength or elasticity.

Preferably, pre-form shapes are installed into captivating cavities 48 of the mating assembly. Installation can be performed by such methods as manually, manually with installation tooling, or with automated machinery. The adhesive sheet can be formulated to have limited or unlimited work time, and then heat cured when curing is convenient.

As illustrated in FIGS. 10A and 10B, support member 34 is joined to component 24 such that the first passages 32 of the component 24 and the second passages 44 of the support member 34 are in fluid communication. To enhance adhesion, a primer 46 can also be applied to load bearing surface 38 of the support member 34 in the same predetermined pattern as applied to the bonding surface 28 of component 24. In alternative embodiments, support member 34 or component 24 may contain plenums to distribute one or more gases for temperature control or process gas supplies in a desired gas distribution pattern. In another embodiment, passages 32 can be in fluid communication with one or more passages 44.

In a preferred embodiment, the sheet adhesive bonds the bonding surface of the component 28 to the load bearing surface of the support member 38 such that there is a 51 to 381 μm (0.002 to 0.015 in) gap therebetween in unbonded regions. For example, a depth of the recess 48 on the support member load bearing surface and/or the component outer surface is preferably 102 to 508 μm (0.004 to 0.020 in), for example 100 to 200 μm or 200 to 500 μm. More preferably, the recess 48 is 178 μm (0.007 in) deep. However, the support member load bearing surface and the component bonding surface can be bonded by the sheet adhesive without a recess. Also preferably, the sheet adhesive bonds the support member load bearing surface parallel to the component bonding surface with a distance between the two mating surfaces varying by less than +/−25 μm (0.001 in).

EXAMPLES

Figure 12:
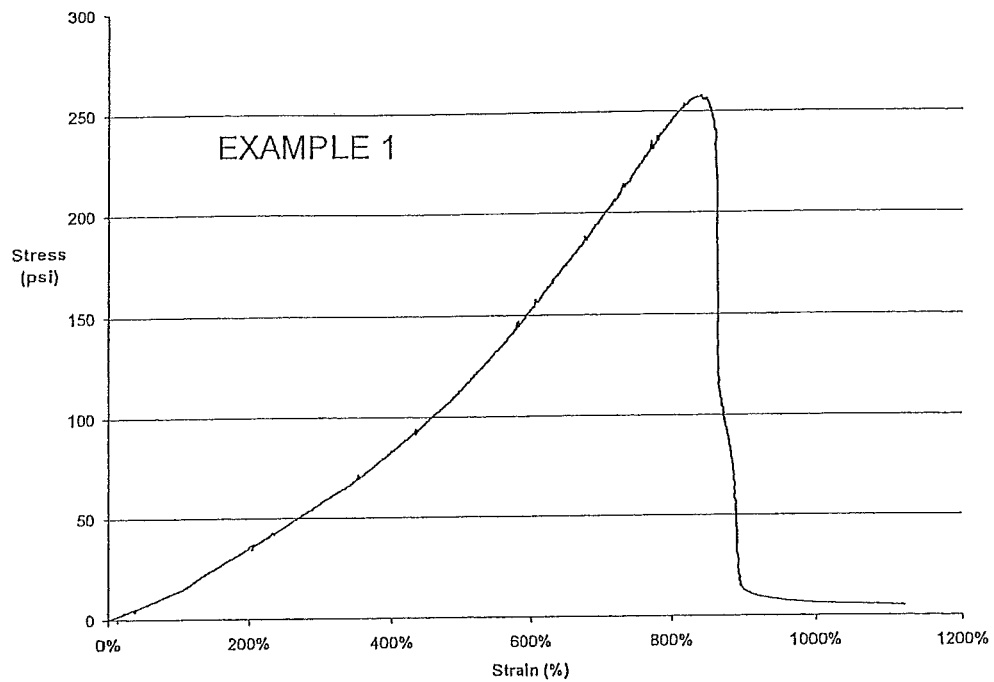
FIG. 12 shows a shear test result conducted at room temperature for sheet adhesive Example 1.

Nonlimiting examples of sheet adhesive were formulated as described above, heat cured and tested. Test specimens were made of the sheet adhesive to simulate the performance of the sheet adhesive in a bond between mating surfaces, however it should be noted that test results of actual bonds between components and support members are not shown here. Shear tests were conducted at room temperature and elevated temperatures, for example, at 180° C. Elevated temperature fatigue tests were conducted at, for example, 180° C. FIG. 12 shows a shear test result of Example 1 sheet adhesive at room temperature. Example 1 shows a near linear stress-strain curve to over 800% shear strain and a low shear stress at high shear strains. A bond made of such a soft sheet adhesive can be suitable to accommodate high shear strains with little diaphraming of bonded component and support member by coupling forces.

Figure 13:
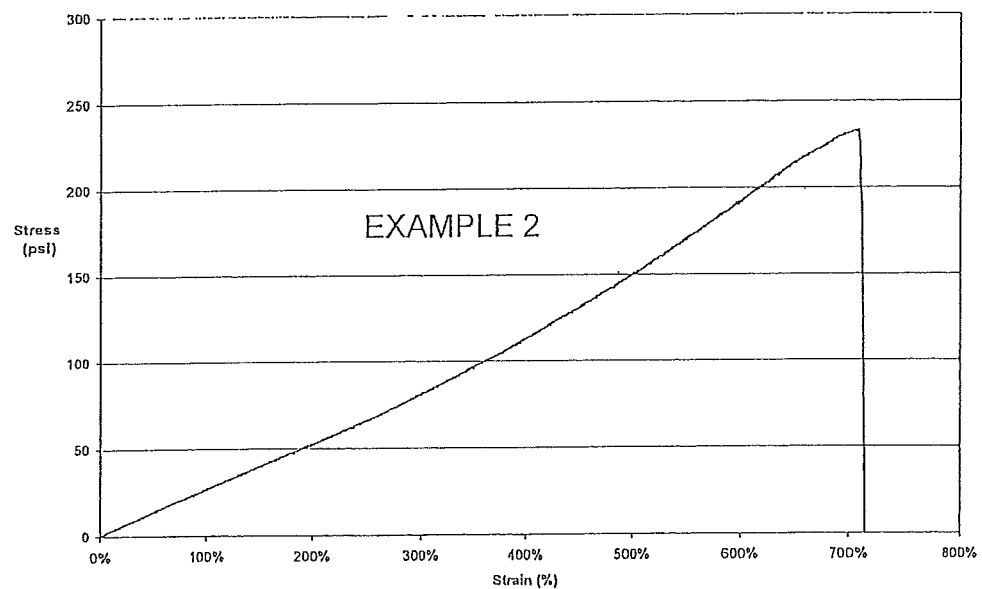
FIG. 13 shows a shear test result conducted at 180° C. for sheet adhesive Example 2.
Figure 15:
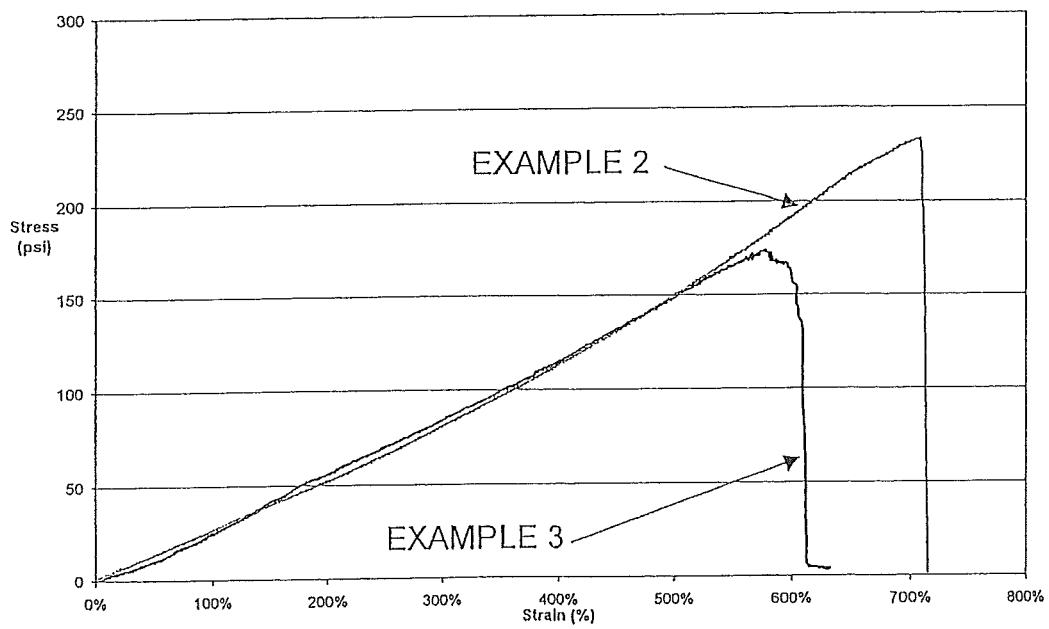
FIG. 15 shows a shear test result conducted at 180° C. for sheet adhesive Example 3 after the fatigue test.

FIGS. 13 and 15 show a shear test result of Example 2 sheet adhesive at 180° C. Example 2 experiences a near linear stress-strain curve to over 700% shear strain at 180° C. and a low strength at high strains. Such a soft sheet adhesive bond can be suitable to accommodate high shear strains without diaphraming of bonded component and support member.

Figure 14:
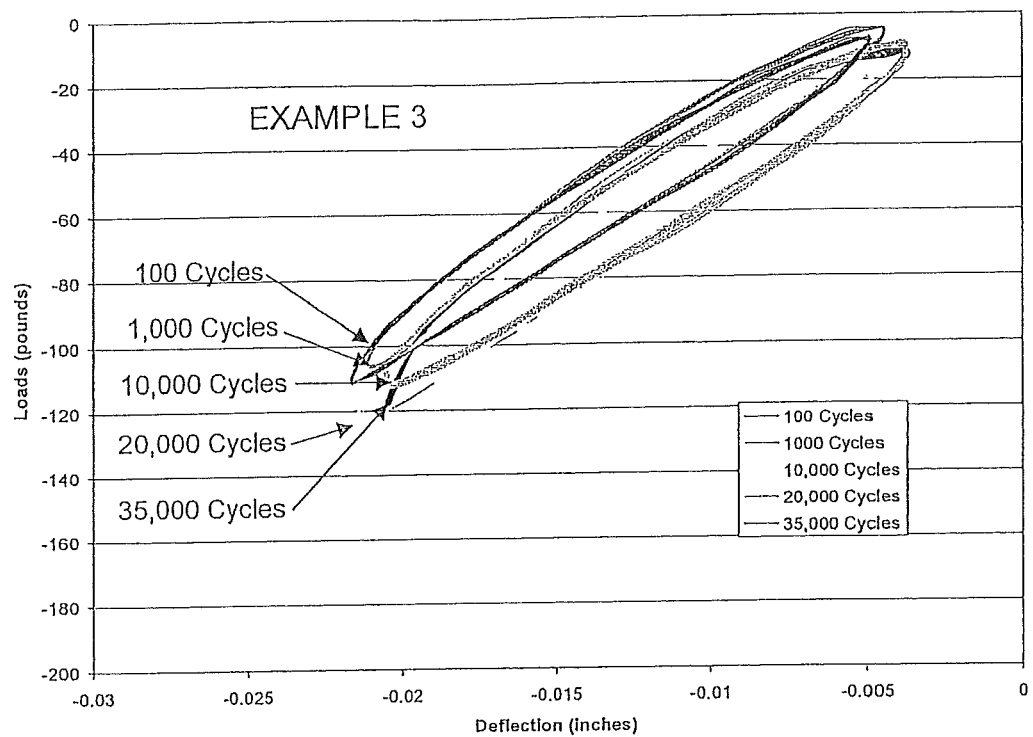
FIG. 14 shows a fatigue test result conducted at 180° C. for sheet adhesive Example 3.

FIG. 14 shows a fatigue test result of Example 3 sheet adhesive at 180° C. The fatigue test was conducted to more than 36,000 cycles (about 35,000 shown). Although only specimens of sheet adhesive were tested, each cycle simulates a thermal cycle where a support member expands by a different amount than a component during plasma processing due to differences in coefficients of thermal expansion of the materials of the component and support member. FIG. 15 shows a shear test result of Example 3 sheet adhesive at 180° C. after the fatigue test to over 36,000 cycles. Example 3 exhibits a near linear stress-strain curve to over 500% shear strain at 180° C. and a low strength at high strains. Such a soft sheet adhesive bond can be suitable to accommodate high shear strains without diaphraming of bonded component and support member even after over 36,000 cycles.

While the invention has been described in detail with reference to specific embodiments thereof, it will be apparent to those skilled in the art that various changes and modifications can be made, and equivalents employed, without departing from the scope of the appended claims.

What is claimed is:

1. A method of joining an assembly for use in a plasma processing apparatus for processing a semiconductor substrate, comprising:
    applying a first surface of a sheet of uncured elastomeric adhesive in a predetermined pattern to at least one load bearing surface of a support member in a predetermined pattern of regions to be bonded which exclude regions to remain unbonded;
    applying at least one bonding surface of a component to a second surface of the sheet of uncured elastomeric adhesive in a predetermined pattern of regions to be bonded, the component having at least one other surface to be exposed to a plasma; and
    bonding the at least one bonding surface of the component to the at least one load bearing surface of the support member with the sheet of elastomeric adhesive therebetween to form the assembly;
    wherein the sheet of elastomeric adhesive is elastically deformable in the lateral direction to at least 500% shear strain by a shear stress of about 50 to 300 psi in a temperature range of room temperature to 300° C.

2. The method of joining an assembly for use in a plasma processing apparatus of claim 1, further comprising:
    applying a primer to the at least one load bearing surface of the support member in a predetermined pattern; and
    applying a primer to the at least one bonding surface of the component in a predetermined pattern.

3. The method of joining an assembly for use in a plasma processing apparatus of claim 2, wherein
    applying primer to the at least one bonding surface of the component comprises covering the at least one bonding surface with a mask having openings in a predetermined pattern and coating the primer on unmasked regions of the at least one bonding surface, and/or
    applying primer to the at least one load bearing surface of the support member comprises covering the at least one load bearing surface with a mask having openings in a predetermined pattern and coating the primer on unmasked regions of the at least one load bearing surface.

4. The method of joining an assembly for use in a plasma processing apparatus of claim 3, wherein the predetermined pattern in the mask is a plurality of semi-annular zones.

5. The method of joining an assembly for use in a plasma processing apparatus of claim 1, wherein
    (a) applying the first surface of the sheet of uncured elastomeric adhesive comprises precutting the sheet of uncured elastomeric adhesive to the predetermined pattern using one of mechanical cutting, die-cutting, laser cutting, water jet cutting, plasma cutting, plotter cutting or combinations thereof;
    (b) the at least one bonding surface of the component and/or the at least one load bearing surface of the support member comprise channels over at least a portion of the predetermined pattern;
    (c) the sheet of uncured elastomeric adhesive is a filled, uncured elastomeric silicone sheet; and/or
    (d) the sheet of uncured elastomeric adhesive is a filled, uncured elastomeric silicone sheet filled with conductive particles of one of aluminum, aluminum oxide, silicon, silicon carbide, boron nitride, or alloys thereof.

6. The method of joining an assembly for use in a plasma processing apparatus of claim 1, wherein
   (a) bonding further comprises seating the sheet adhesive by pressing the at least one bonding surface of the component and the at least one load bearing surface of the support member together under a static weight or optionally by atmospheric pressure within a vacuum bag, wherein the sheet of uncured elastomeric adhesive is heat curable;
   (b) heating the assembly to cure the uncured elastomeric adhesive after seating when the static weight or the vacuum is removed;
   (c) the component is of single crystal silicon, polycrystalline silicon, graphite, quartz, ceramic, silicon carbide, yttria-containing ceramic, BN, $B_4C$ or combination thereof; and the support member is composed of aluminum, graphite, copper, alumina, quartz, zirconia, silicon nitride, aluminum nitride, silicon carbide or combination thereof;
   (d) applying the first surface of the sheet of uncured elastomeric adhesive comprises removing a transfer sheet from the first surface before applying the first surface to the at least one load bearing surface of the support member;
   (e) applying the at least one bonding surface of the component comprises removing a transfer sheet from the second surface of the sheet of elastomeric adhesive before applying the at least one bonding surface of the component to the second surface of the sheet of uncured elastomeric adhesive;
   (f) applying the first surface of the sheet of uncured elastomeric adhesive comprises applying a vacuum to the sheet of uncured elastomeric adhesive and the support member after applying the first surface to the at least one load bearing surface of the support member to remove gaps therebetween;
   (g) applying the at least one bonding surface of the component comprises applying a vacuum to the sheet of uncured elastomeric adhesive, the component and the support member after applying the at least one bonding surface of the component to the second surface of the sheet of uncured elastomeric adhesive to remove gaps therebetween; and/or
   (h) the component comprises a substrate support, a ring surrounding the substrate, a plasma confining screen, an optics tube window, a chamber sidewall liner, a gas injector, a gas ring, a gas nozzle, a gas distribution plate, and/or a temperature controlled gas distribution plate and the support member comprises a lower electrode, a mechanical clamp, an electrostatic chucking device, an optics tube, and/or a chamber sidewall bounding the plasma processing chamber.

7. The method of joining an assembly for use in a plasma processing apparatus of claim 1, wherein the sheet of elastomeric adhesive comprises a thermally conductive and/or electrically conductive silicone adhesive sheet.

8. The method of joining an assembly for use in a plasma processing apparatus of claim 1, wherein the sheet of elastomeric adhesive is elastically deformable in the lateral direction to at least 800% shear strain by a shear stress of about 50 to 300 psi in a temperature range of room temperature to 300° C.

9. The method of joining an assembly for use in a plasma processing apparatus of claim 1, wherein the sheet of elastomeric adhesive is elastically deformable in the lateral direction to at least 500% shear strain from a shear stress of about 50 to 300 psi in a temperature range of room temperature to 300° C. after 5000 temperature cycles of heating the bonded component assembly from room temperature to 250° C.

10. The method of joining an assembly for use in a plasma processing apparatus of claim 1, wherein the sheet of elastomeric adhesive comprises two or more laminated or co-planar layers.

11. The method of joining an assembly for use in a plasma processing apparatus of claim 10, wherein the two or more laminated or co-planar layers have different physical properties selected from the group consisting of thermal conductivity, elasticity, tensile and shear strength, thickness, thermal coefficient of expansion, chemical resistance, particle erosion, and service temperature range.

12. The method of joining an assembly for use in a plasma processing apparatus of claim 1, wherein the sheet of elastomeric adhesive comprises a uniform distribution of thermally conductive filler.

13. The method of joining an assembly for use in a plasma processing apparatus of claim 12, wherein the thermally conductive filler is of boron nitride (BN), aluminum oxide ($Al_2O_3$), silicon, silicon carbide, or combination thereof.

14. The method of joining an assembly for use in a plasma processing apparatus of claim 1, wherein the sheet of elastomeric adhesive is of (i) high molecular weight dimethyl silicone and the thermally conductive filler, (ii) high molecular weight dimethyl silicone and the thermally conductive filler matrixed around fiberglass screen (scrim), (iii) high molecular weight dimethyl silicone and the thermally conductive filler matrixed around metallic screen or (iv) high molecular weight dimethyl silicone and the thermally conductive filler mixed with glass microbeads and/or nanobeads.

15. The method of joining an assembly for use in a plasma processing apparatus of claim 1, wherein a gap distance between the mating surfaces varies by less than +/−25 µm (0.001 in).

16. The method of joining an assembly for use in a plasma processing apparatus of claim 1, wherein one of the mating surfaces comprises a cavity.

17. The method of joining an assembly for use in a plasma processing apparatus of claim 16, wherein (a) the cavity depth is in a range of 100 to 200 µm; (b) the cavity depth is in a range of 200 to 500 µm; or (c) the cavity comprises an elevation jog sized to match a dimension of the sheet adhesive.

18. A method of joining an assembly for use in a plasma processing apparatus for processing a semiconductor substrate, comprising:
    applying a first surface of a sheet of uncured elastomeric adhesive in a predetermined pattern to at least one load bearing surface of a support member in a predetermined pattern of regions to be bonded which exclude regions to remain unbonded;
    applying at least one bonding surface of a component to a second surface of the sheet of uncured elastomeric adhesive in a predetermined pattern of regions to be bonded, the component having at least one other surface to be exposed to a plasma; and
    bonding the at least one bonding surface of the component to the at least one load bearing surface of the support member with the sheet of elastomeric adhesive therebetween to form the assembly;
    wherein at least one portion of the sheet of elastomeric adhesive has a thermal conductivity of about 0.2 to 1.0

W/mK and another portion of the sheet of elastomeric adhesive has a thermal conductivity of over 1.0 W/mK.

* * * * *